United States Patent
Katou (10) Patent No.: US 10,818,682 B2
(45) Date of Patent: Oct. 27, 2020

(54) METHOD OF MANUFACTURING SEMICONDUCTOR DEVICE

(71) Applicant: RENESAS ELECTRONICS CORPORATION, Tokyo (JP)

(72) Inventor: Shigeki Katou, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/368,512

(22) Filed: Mar. 28, 2019

(65) Prior Publication Data

US 2019/0312048 A1    Oct. 10, 2019

(30) Foreign Application Priority Data

Apr. 10, 2018  (JP) .................................. 2018-075251

(51) Int. Cl.

| H01L 27/115 | (2017.01) |
|---|---|
| H01L 27/11568 | (2017.01) |
| H01L 27/11565 | (2017.01) |
| H01L 27/11573 | (2017.01) |
| H01L 29/78 | (2006.01) |
| H01L 21/768 | (2006.01) |
| H01L 21/321 | (2006.01) |
| H01L 21/311 | (2006.01) |
| H01L 29/66 | (2006.01) |
| H01L 21/28 | (2006.01) |
| H01L 21/762 | (2006.01) |

(52) U.S. Cl.

CPC .. *H01L 27/11568* (2013.01); *H01L 21/31116* (2013.01); *H01L 21/3212* (2013.01); *H01L 21/76224* (2013.01); *H01L 21/76802* (2013.01); *H01L 27/11565* (2013.01); *H01L 27/11573* (2013.01); *H01L 29/40117* (2019.08); *H01L 29/66795* (2013.01); *H01L 29/785* (2013.01); *H01L 29/7851* (2013.01)

(58) Field of Classification Search

CPC ............ H01L 27/11568; H01L 29/785; H01L 21/76224; H01L 29/40117; H01L 27/11565; H01L 27/11573; H01L 29/7851; H01L 21/76802; H01L 21/3212; H01L 21/31116; H01L 29/66795

See application file for complete search history.

(56) References Cited

U.S. PATENT DOCUMENTS

| 7,608,890 B2 | 10/2009 | Yagishita |
|---|---|---|
| 2007/0170474 A1 | 7/2007 | Kawasaki |
| 2014/0227857 A1* | 8/2014 | Youn ................. H01L 21/76229 438/427 |

FOREIGN PATENT DOCUMENTS

| JP | 2006-351683 A | 12/2006 |
|---|---|---|
| JP | 2007-201021 A | 8/2007 |

* cited by examiner

*Primary Examiner* — Matthew L Reames
(74) *Attorney, Agent, or Firm* — McDermott Will & Emery LLP

(57) ABSTRACT

To provide, in an increased production yield, a reliability-improved semiconductor product having both a planar type transistor and a fin type transistor. A semiconductor device having both a planar type transistor and a fin type transistor is manufactured by decreasing the thickness of a hard mask for the formation of element isolation in the planar type transistor region prior to formation of element isolation in the fin type transistor region.

6 Claims, 10 Drawing Sheets

FIG. 1

FIG. 2A
Fin-MONOS REGION

FIG. 2B
Planar REGION

METHOD OF MANUFACTURING SEMICONDUCTOR DEVICE

CROSS-REFERENCE TO RELATED APPLICATIONS

The disclosure of Japanese Patent Application No. 2018-075251 filed on Apr. 10, 2018 including the specification, drawings and abstract is incorporated herein by reference in its entirety.

BACKGROUND

The present invention relates to the structure of a semiconductor device and a method of manufacturing the semiconductor device, in particular, to a technology effective when applied to a semiconductor device having both a planar type transistor and a fin type transistor.

As semiconductor products come to have high functionality, those having, on one semiconductor chip, both a memory element and a high withstand element or a logic element have become widespread.

As a memory element to be mounted together with a logic element on one chip, there is a split-gate MONOS flash memory (SG-MONOS). This SG-MONOS is a charge-trap flash memory using, as a charge trap film, a MONOS (metal oxide nitride oxide silicon) film and having a gate electrode separated into two gates, that is, a select gate (CG) and a memory gate (MG).

The memory element tends to use a fin type transistor (Fin-FET) having a fin structure which is advantageous for miniaturization of the semiconductor process and more effective for improvement in transistor performance and reduction in energy consumption than a related-art transistor having a planar structure. A split-gate MONOS flash memory (SG-MONOS) having a fin structure is therefore under development.

On the other hand, the high withstand element and the logic element use a related-art planar type transistor mainly from the standpoint of a manufacturing cost so that various measures have been taken to develop a semiconductor process for mounting both a planar type transistor and a fin type transistor on one chip.

There is a technology described, for example, in Patent Document 1 as a background art in the present technical field. Patent Document 1 describes a semiconductor device having both a planar type transistor and a fin type transistor. This semiconductor device has desired characteristics by making the height of an element isolation layer in a planar type transistor region greater than the height of an element isolation layer in a fin type transistor region and at the same time, by forming an element isolation layer having a plurality of heights in the fin type transistor region, thereby providing semiconductor elements having respectively different characteristics.

Patent Document 2 discloses a technology of forming uniform fins with a narrow pitch width by using a sidewall pattern transfer (SWT) technology.

PATENT DOCUMENT

[Patent Document 1] Japanese Unexamined Patent Application Publication No. 2007-201021
[Patent Document 2] Japanese Unexamined Patent Application Publication No. 2006-351683

SUMMARY

As described above, when a peripheral element such as high withstand element or logic element is mounted together with a split-gate MONOS flash memory (SG-MONOS), the SG-MONOS adopts a fin type transistor (Fin-FET structure) and the peripheral element adopts a planar type transistor.

In a semiconductor process for mounting both a planar type transistor and a fin type transistor on one chip, it is difficult to simultaneously form element isolation (STI: shallow trench isolation) in both a planar type transistor region and a fin type transistor region so that element isolation (STI) is formed first in the planar type transistor region and then in the fin type transistor region.

At least twice CMP (chemical mechanical polishing) is therefore required for the formation of element isolation (STI) in the planar type transistor region and for the formation of element isolation (STI) in the fin type transistor region.

The second CMP, that is, CMP for the formation of element isolation (STI) in the fin type transistor region uses an autostop type slurry having low dishing performance because of a difference in pattern occupancy of a film lying below a buried oxide film to be polished. This autostop type slurry has such properties as having a small difference in polishing rate between a silicon oxide film ($SiO_2$) and a silicon nitride film ($Si_3N_4$) and in addition, having a low polishing rate for both of these films.

When this slurry is used, a CMP rate decreases drastically after CMP is performed to expose an $Si_3N_4$ hard mask for the formation of element isolation (STI) in the planar type transistor region so that in the fin type transistor region from which the $Si_3N_4$ hard mask has retreated, a buried oxide film to be polished remains on the $Si_3N_4$ hard mask and hinders subsequent removal of the $Si_3N_4$ hard mask. There is therefore a fear that the silicon oxide film or $Si_3N_4$ hard mask that has remained without being polished may demand an additional step for removing it or may lead to a reduction in the yield of products.

Another problem and novel features will be apparent from the description herein and accompanying drawings.

According to one embodiment disclosed herein, in a semiconductor device having both a planar type transistor and a fin type transistor, a hard mask for the formation of element isolation in a planar type transistor region is made thin before formation of element isolation in a fin type transistor region.

The one embodiment makes it possible to provide a semiconductor device having both a planar type transistor and a fin type transistor while preventing a $Si_3N_4$ hard mask from remaining without being polished at the time of forming element isolation (STI) in the fin type transistor region.

Due to this advantage, a reliability-improved semiconductor product having both a planar type transistor and a fin type transistor can be provided in an improved production yield.

DETAILED DESCRIPTION

Examples will hereinafter be described referring to drawings. In these drawings, configurations same as each other will be identified by the same reference mark and an overlapping portion will not be described in detail.

Example 1

The structure of the semiconductor device of Example 1 and a manufacturing method thereof will be described referring to FIGS. 1 to 27.

Structure of Semiconductor Device of Present Example

Figure 1:
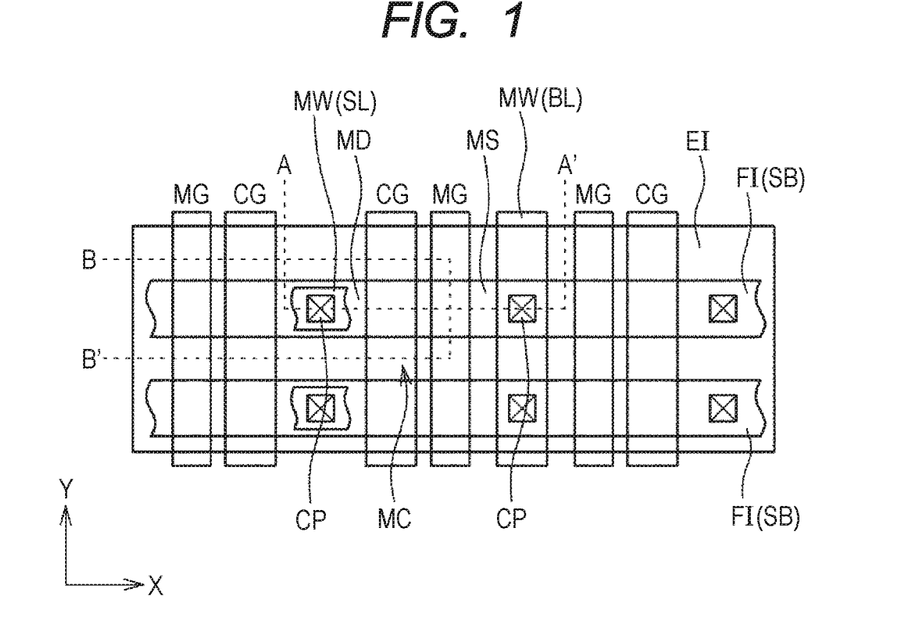
FIG. 1 is a plan view showing a part of a semiconductor device according to one embodiment of the invention.

FIG. 1 is a plan view showing a memory cell array of the semiconductor device of the present example. The memory cell array is comprised of a plurality of memory cells MC. A region having a memory cell therein will hereinafter be called "memory cell region". The memory cell region has therein a plurality of fins FIN which extend in an X direction and is placed at predetermined intervals in a Y direction. The X direction and the Y direction are directions along the main surface of a semiconductor substrate SB and the X direction crosses (is orthogonal to) the Y direction.

The fins FI each have thereon a plurality of control gate electrodes CG and a plurality of memory gate electrode MG, each extending in the Y direction. The fins FI have, on the upper surface thereof, a drain region MD and a source region MS so as to sandwich therebetween a control gate electrode CG and a memory gate electrode MG and these regions are on the side of the control gate electrode CG and on the side of the memory gate electrode, respectively. This means that in the X direction, one control gate electrode CG and one memory gate electrode MG adjacent to each other are present between a source region MS and a drain region MD.

A drain region MD and a source region MS are each an n type semiconductor region. A drain region MD lies between two control gate electrodes CG adjacent to each other in the X direction, while a source region MS lies between two memory gate electrodes MG adjacent to each other in the X direction. A memory cell MC is a nonvolatile memory element comprised of a control gate electrode CG, a memory gate electrode MG, a drain region MD, and a source region MS. A source region MS and a drain region MD configuring one memory cell MC may hereinafter be called "source-drain region".

Two memory cells MC adjacent to each other in the X direction have a drain region MD or a source region MS in common. Two memory cells MC having a drain region MD in common is line-symmetric in the X direction with the drain region MD extending in the Y direction as an axis and two memory cells MC having a source region in common is line symmetric in the X direction with the source region MS extending in the Y direction as an axis.

Each fin FI has a plurality of memory cells MC arranged in the X direction. The drain region MD of each of the memory cells MC is electrically coupled to a source line SL comprised of a wiring MW extending in the X direction via a contact plug (via) CP formed in a contact hole penetrating through an interlayer insulating film (not shown) formed on the memory cell MC. The source region MS of the plurality of memory cells MC arranged in the Y direction is electrically coupled to a bit line BL comprised of a wiring MW extending in the Y direction.

The fin FI is a protruding semiconductor layer having a substantially rectangular parallelepiped shape and it protrudes from the main surface of the semiconductor substrate SB in a direction perpendicular thereto. The fin FI is not always necessary to be a rectangular parallelepiped and it may be rounded at the corner of the rectangle in a cross-sectional view in the short-side direction. The respective side surfaces of the fin FI may be orthogonal to the main surface of the semiconductor substrate SB, but it may have an inclination angle near a right angle. This means that the fins FI each have a substantially rectangular or trapezoidal cross-sectional shape.

As shown in FIG. 1, in plan view of the semiconductor substrate SB, an extending direction of each fin FI is a long-side direction thereof and a direction orthogonal to the long-side direction is a short-side direction of each fin. This means that the length of the fin is larger than the width of the fin. The shape of the fin FI is not limited insofar as it is a protruding semiconductor layer having a length, a width, and a height. For example, it may have a zigzag layout in plan view.

Figure 2A:
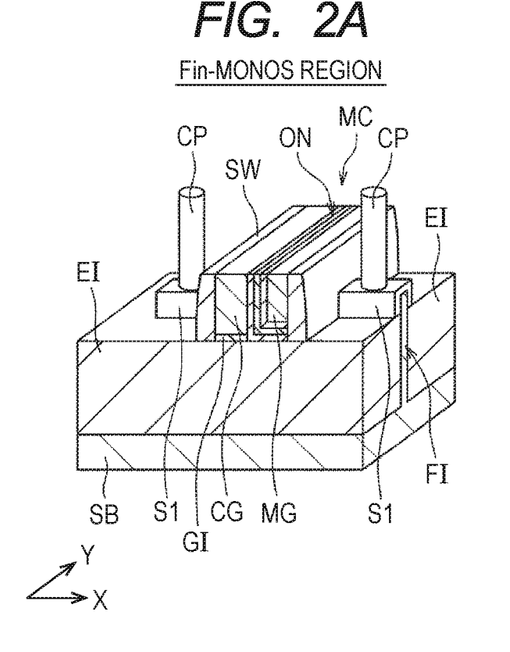
FIGS. 2A and 2B are each a perspective view showing a part of the semiconductor device according to the one embodiment of the invention.
Figure 2B:
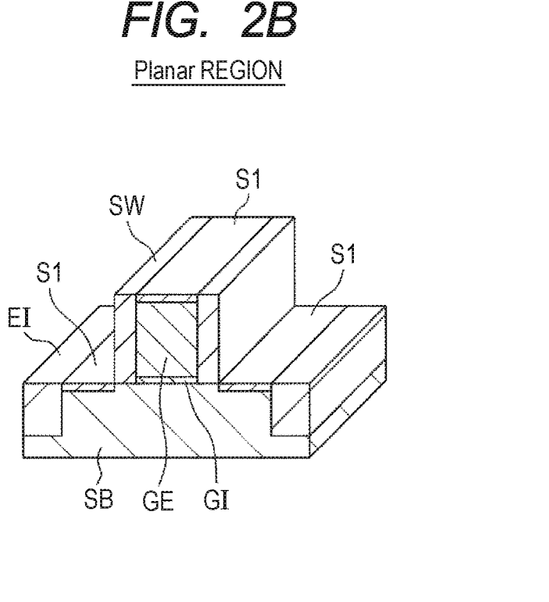

FIGS. 2A and 2B are each a perspective view of the semiconductor device of the present example. A memory cell region (Fin-MONOS region) is shown in the left drawing (FIG. 2A) and a planar region (peripheral element region such as high withstand element or logic element) is shown in the right drawing (FIG. 2B). To facilitate understanding of the structure of the memory cell region, an element isolation film EI, an interlayer insulating film and a wiring on each element, a cap insulating film on a control gate electrode CG, and a cap insulating film on a memory gate electrode MG are omitted from FIG. 2A. The fin FI in the memory region has thereabove the memory cell MC. As shown in FIG. 2A, the control gate electrode CG and the memory gate electrode MG extend in the Y direction so as to cross the fin FI and stride over the fin FI.

As shown in FIG. 2B, the peripheral element region (planar region) such as high withstand element or logic element has a gate electrode GE made of polysilicon (Poly-Si) or the like via a gate insulating film GI such as thin silicon oxide film ($SiO_2$) on the semiconductor substrate SB. The gate electrode GE extends in the Y direction along the main surface of the semiconductor substrate SB and it has, on the side wall thereof, a sidewall SW made of a silicon nitride film ($Si_3N_4$) or the like.

The semiconductor substrate SB has an unillustrated source-drain region (source region MS and drain region MD) so as to sandwich the gate electrode GE therebetween and this source-drain region, the gate electrode GE, and the gate insulating film GI configure a planar type transistor. The planar type transistor is electrically separated from another element adjacent thereto by element isolation EI. The gate electrode GE and the source-drain region have thereon a silicide layer S1. To facilitate understanding of the structure of the planar type transistor, an interlayer insulating film, a wiring, and a contact plug (via) C are omitted from FIG. 2B.

Figure 3:
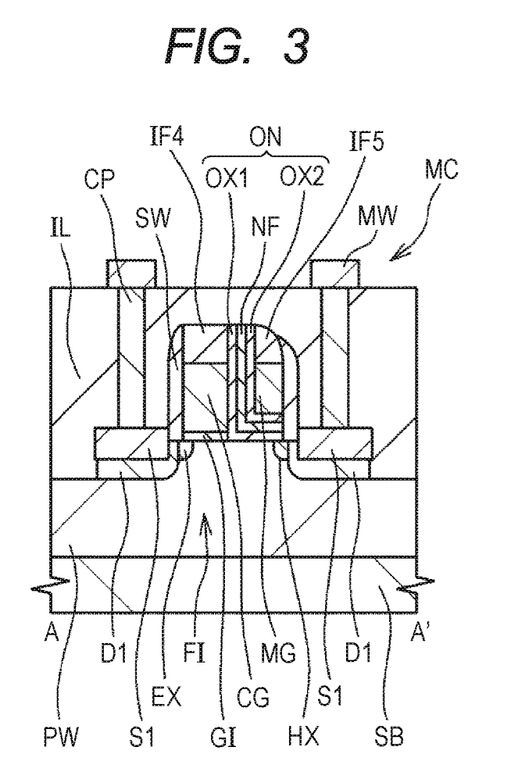
FIG. 3 is a cross-sectional view taken along the line A-A' of FIG. 1.

The structure of the memory cell region (Fin-MONOS region) will next be described more specifically referring to FIG. 3. FIG. 3 is a cross-sectional view taken along the line A-A' of FIG. 1. Two or more elements are arranged on one fin FI, but FIG. 3 shows only one memory cell MC on the fin FI.

As shown in FIG. 3, the upper surface of the control gate electrode CG is covered with a cap insulating film IF4 and the upper surface of the memory gate electrode MG is covered with a cap insulating film IF5. The cap insulating films IF4 and IF5 are each made of, for example, a silicon nitride ($Si_3N_4$) film. The control gate electrode CG and the memory gate electrode MG are each made of, for example, a polysilicon film (Poly-Si) and the polysilicon film has an n type impurity (for example, P (phosphorus) or As (arsenic)) introduced therein.

As shown in FIG. 2A and FIG. 3, the upper surface and the side surface of the fin FI having thereon a diffusion region D1 configuring the source-drain region of the memory cell region are covered with the silicide layer S1. The silicide layer S1 is made of, for example, NiSi (nickel silicide). The silicide layer S1 is made of a layer extending along the upper surface and side surface of the fin FI.

As shown in FIG. 1 and FIG. 2A, the fins FI are, at the lower portion of the side surface thereof, surrounded by an element isolation film EI formed on the main surface of the semiconductor substrate SB. This means that the fins FI are isolated from each other by the element isolation film EI. As shown in FIG. 3, the fin FI has therein a p well PW which is a p type semiconductor region extending from the upper surface to the lower portion of the fin FI.

The fin FI has, on the upper surface and side surface thereof, a control gate electrode CT via the gate insulating film GI and the control gate electrode CG has, in a region adjacent thereto in the long-side direction (in X direction) of the fin FI, a memory gate electrode MG via an ONO film ON. The control gate electrode CG and the memory gate electrode MG have therebetween an ONO film ON and the control gate electrode CG and the memory gate electrode MG are electrically isolated from each other by the ONO film ON. The memory gate electrode MG and the upper surface of the fin FI have therebetween the ONO film ON. The ONO film ON lies continuously so as to cover the side surface and bottom surface of the memory gate electrode MG. The ONO film ON therefore has an L-shaped cross-section in the cross-section extending along the gate length direction as shown in FIG. 3.

The gate insulating film GI is a thermal oxide film (silicon oxide film) formed by thermal oxidation of the main surface and the side surface of the fin FI which is a protruding semiconductor layer of the semiconductor substrate SB made of silicon and it has a film thickness of, for example, 2 nm. The ONO film ON is comprised of a silicon oxide film OX1 made of a thermal oxide film (silicon oxide film) obtained by thermally oxidizing the main surface and side surface of the fin FI which is a protruding semiconductor layer of the semiconductor substrate made of silicon, a silicon nitride film NF formed on the silicon oxide film OX1, and a silicon oxide film OX2 formed on the silicon nitride film NF. The silicon nitride film NF is a charge accumulation portion (charge accumulation layer) of the memory cell MC. A thickness of the silicon oxide film OX1 is, for example, 4 nm, a thickness of the silicon nitride film NF is, for example, 7 nm, and a thickness of the silicon oxide film OX2 is, for example, 9 nm.

In short, the ONO film ON has a stacked structure comprised of the silicon oxide film OX1, the silicon nitride film NF, and the silicon oxide film OX2 stacked in order from the upper surface side of the fin FI and from the side surface side of the control gate electrode CG (in order of from the lower layer to the upper layer). A thickness of the ONO film ON is, for example, 20 nm and is greater than that of the gate insulating film GI below the control gate electrode CG. The silicon oxide film OX2 may alternatively be made of a silicon oxynitride (SiON) film.

In the short-side direction (Y direction) of the fin FI, the control gate electrode CG extends along the upper surface and the side surface of the fin FI and the upper surface of the element isolation film EI via the gate insulating film GI. Similarly, in the short-side direction of the fin FI, the memory gate electrode MG extends along the main surface and the side surface of the fin FI and the upper surface of the element isolation film EI via the ONO film ON.

A pattern including the control gate electrode CG, memory gate electrode MG, gate insulating film GI, ONO film ON, and cap insulating films IF4 and IF5 is covered with the sidewall (sidewall spacer) SW. The sidewall SW is comprised of a stacked structure of a silicon nitride film and a silicon oxide film. The silicide layer S1 covers surface of the fin FI exposed from the above-described pattern including the control gate electrode CG and the sidewall SW.

As shown in FIG. 3, the fin FI has, at the upper surface thereof, a pair of source and drain regions so as to sandwich the upper surface of the fin FI right below the above-described pattern including the control gate electrode CG. The source region and drain region each have an extension region EX which is an n⁻ type semiconductor region and a diffusion region D1 which is an n⁺ type semiconductor region. The diffusion region D1 has an impurity concentration higher and a formation depth larger than those of the extension region EX. In each of the source region and the drain region, the extension region EX and the diffusion region D1 are in contact with each other. The extension region EX is closer to the upper surface of the fin FI right below the pattern, that is, closer to the channel region than the diffusion region D1 is.

The drain region MD is adjacent to the fin FI right below the control gate electrode CG and the source region MS is adjacent to the fin FI right below the memory gate electrode MG. This means that of source and drain regions sandwiching therebetween the control gate electrode CG and the memory gate electrode MG in plan view, the drain region MD is situated on the side of the control gate electrode CG and the source region MS is situated on the side of the memory gate electrode MG. In other words, in plan view, the drain region MD is adjacent to the control gate electrode CG and the source region MS is adjacent to the memory gate electrode MG.

Thus, a transistor having, as a source-drain region, that having a LDD (lightly doped drain) structure, more specifically, a structure having a lightly doped extension region EX and a heavily doped diffusion region D1 can have improved short-channel characteristics. The above-described source region corresponds to the source region MS shown in FIG. 1 and the above-described drain region corresponds to the drain region MD shown in FIG. 1.

As shown in FIG. 3, the fin FI and the element isolation film EI have thereon an interlayer insulating film IL made of, for example, a silicon oxide film. The interlayer insulating film IL covers each of the fin FI, element isolation film EI, control gate electrode CG, memory gate electrode MG, source-drain region MS and MD, cap insulating films IF4 and IF5, sidewall SW, and silicide layer S1. The interlayer insulating film IL has a planarized upper surface.

The interlayer insulating film IL has thereon a plurality of wirings MW and the wirings MW are electrically coupled to the source region and the drain region of the memory cell MC via a contact plug CP provided in a contact hole penetrating through the interlayer insulating film IL. The bottom surface of the contact plug CP is in direct contact with the upper surface of the silicide layer S1 and the contact plug CP is electrically coupled to the source-drain region via the silicide layer S1. The silicide layer S1 has a role of reducing coupling resistance between the contact plug CP which is a coupling portion made of, for example, a metal film mainly containing tungsten (W) and the source-drain region in the fin FI made of a semiconductor.

In a power supply region (not shown) of the control gate electrode CG, due to removal of the cap insulating film IF4 formed on the control gate electrode CG and a contact plug CP is coupled to the upper surface of the control gate electrode CG via the silicide layer. In a power supply region (not shown) of the memory gate electrode MG, due to removal of the cap insulating film IF5 formed on the memory gate electrode MG and a contact plug CP is coupled to the upper surface of the memory gate electrode MG via the silicide layer.

The memory cell MC is a nonvolatile memory element having the control gate electrode CG, memory gate electrode MG, drain region, and source region. The control gate electrode CG and the source-drain region configure a control transistor; the memory gate electrode MG and the source-drain region configure a memory transistor; and the memory cell MC is comprised of the control transistor and the memory transistor. This means that the control transistor and the memory transistor have the source-drain region in common. The distance between the drain region and the source region in the gate-length direction (X direction) of the control gate electrode CG and the memory gate electrode MG corresponds to a channel length of the memory cell MC. The control transistor and the memory transistor are each a FinFET having, as a channel, the surface of the fin FI.

Method of Manufacturing the Semiconductor Device of the Present Example

Next, a method of manufacturing a semiconductor device having both the planar type transistor and the fin type transistor as shown in FIG. 2 will next be described referring to FIGS. 4 to 27. In FIGS. 2A and 2B, a split-gate MONOS flash memory (SG-MONOS) having a fin structure (Fin-FET structure) is shown on the left drawing (FIG. 2A) and a planar type peripheral element such as high withstand element or logic element is shown on the right drawing (FIG.

2B). In FIGS. 4 to 27, however, the high withstand element (HV) and the logic element (Logic) are shown individually.

Figure 4:
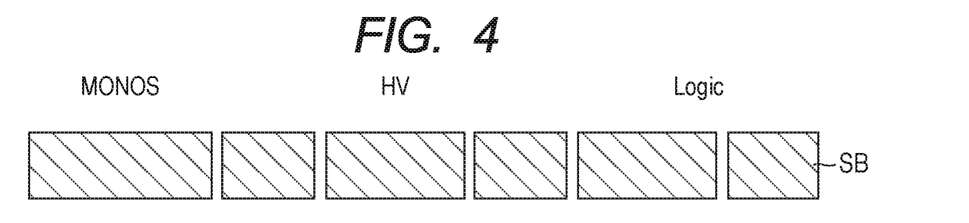
FIG. 4 is a cross-sectional view showing a manufacturing procedure of the semiconductor device according to the one embodiment of the invention (Example 1)

First, as shown in FIG. 4, a semiconductor substrate SB for forming a planar type transistor and a fin type transistor are provided. Each transistor is formed on the surface (main surface) of the semiconductor substrate SB.

Figure 5:
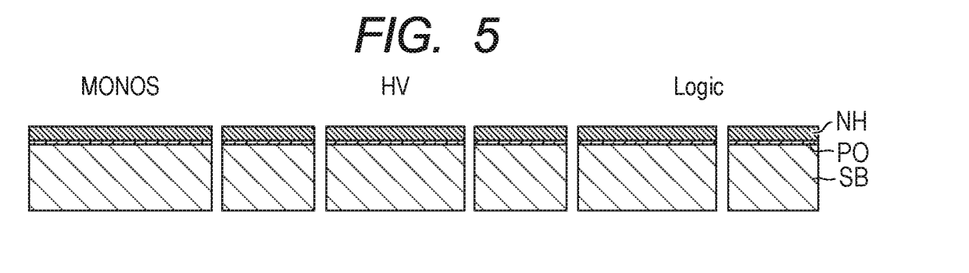
FIG. 5 is a cross-sectional view showing a manufacturing procedure of the semiconductor device following that of FIG. 4.

Next, as shown in FIG. 5, the main surface of the semiconductor substrate SB is thermally oxidized to form a pad oxide film (silicon oxide film) PO having a thickness of, for example, from about 10 nm to 11 nm. Then, a silicon nitride film NH serving as a hard mask for the formation of element isolation EI and having a thickness of, for example, about 120 nm (from 100 nm to 150 nm) is deposited on the pad oxide film PO by plasma CVD (chemical vapor deposition).

Figure 6:
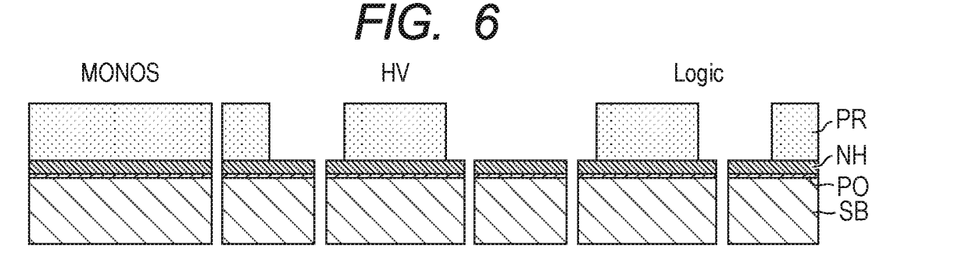
FIG. 6 is a cross-sectional view showing a manufacturing procedure of the semiconductor device following that of FIG. 5.

Next, as shown in FIG. 6, a photoresist film PR is applied onto the silicon nitride film NH and is patterned to form element isolation EI of a peripheral element region such as high withstand element (HV element) or logic element. At this time, no pattern is formed in a MONOS formation region.

Figure 7:
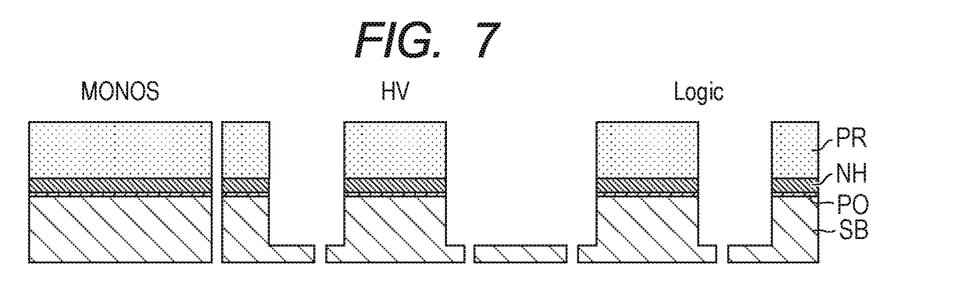
FIG. 7 is a cross-sectional view showing a manufacturing procedure of the semiconductor device following that of FIG. 6.

Next, as shown in FIG. 7, with the silicon nitride film NH as an etching mask, a trench (STI trench) for the formation of the element isolation (EI) is formed in the semiconductor substrate SB in the peripheral element region by anisotropic dry etching with a chlorine gas ($Cl_2$) or a hydrogen bromide (HBr) gas.

Figure 8:
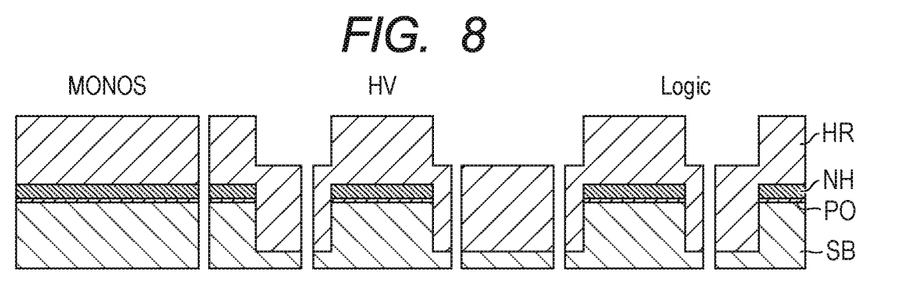
FIG. 8 is a cross-sectional view showing a manufacturing procedure of the semiconductor device following that of FIG. 7.

Next, as shown in FIG. 8, an insulating film having a good burying property is formed on the main surface of the semiconductor substrate SB so as to fill the trench (STI trench). As this buried insulating film, for example, a HARP film (high aspect ratio process) HR is used. The HARP film is a silicon oxide film having a high burying property and formed by changing an {ozone ($O_3$)}:{TEOS (tetra ethyl ortho silicate)} flow rate ratio. After formation of the HARP film, edging treatment (oxidizing treatment) for treating a projection formed at a corner or step portion is performed if necessary.

Figure 9:
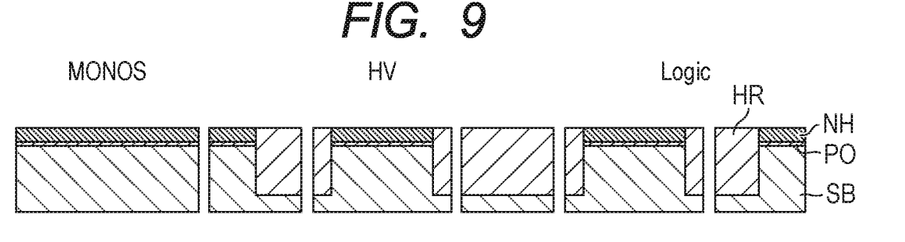
FIG. 9 is a cross-sectional view showing a manufacturing procedure of the semiconductor device following that of FIG. 8.

Next, as shown in FIG. 9, CMP (chemical mechanical polishing) is performed to polish and remove the HARP film HR on the main surface of the semiconductor substrate SB while leaving the HARP film HR in the trench (STI trench). At this time, the silicon nitride film NH functions as a CMP stopper and after CMP, its thickness decreases to about 90 nm (from 70 nm to 120 nm). By this procedure, element isolation EI made of the HARP film HR is formed in the peripheral element region such as high withstand element (HV element) or logic element.

Figure 10:
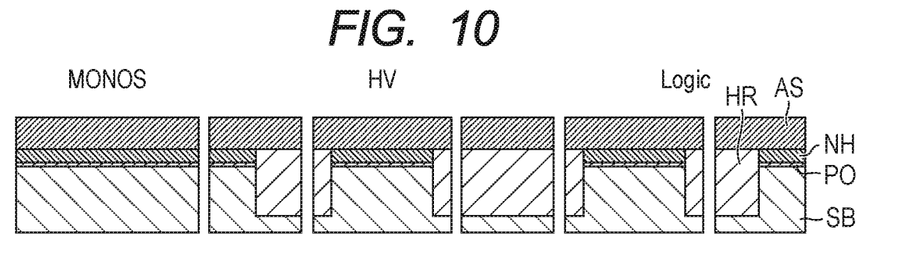
FIG. 10 is a cross-sectional view showing a manufacturing procedure of the semiconductor device following that of FIG. 9.

Next, as shown in FIG. 10, an amorphous silicon film (α-Si) AS with a thickness of, for example, about 160 nm (from 100 nm to 190 nm) is formed by CVD on the main surface of the semiconductor substrate SB.

Figure 11:
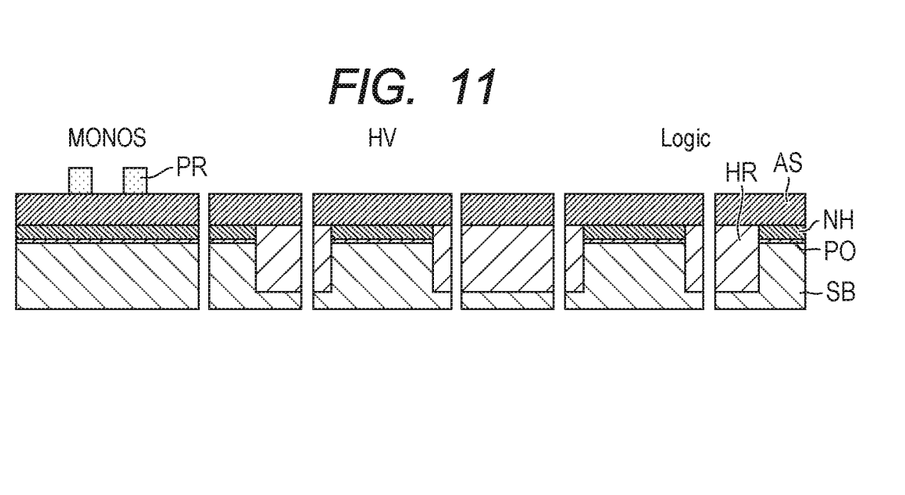
FIG. 11 is a cross-sectional view showing a manufacturing procedure of the semiconductor device following that of FIG. 10.

Next, as shown in FIG. 11, a mask pattern (photoresist PR) for the formation of a fin structure in a MONOS formation region is formed. This mask pattern (photoresist PR) is formed by applying a photoresist film onto the amorphous silicon film AS and then carrying out photolithography. At this time, no mask pattern is formed in the formation region of the peripheral element such as high withstand element (HV element) or logic element. This photolithography will hereinafter be called "mandrel exposure" meaning formation of a mold (mandrel) for the formation of a fin structure.

Figure 12:
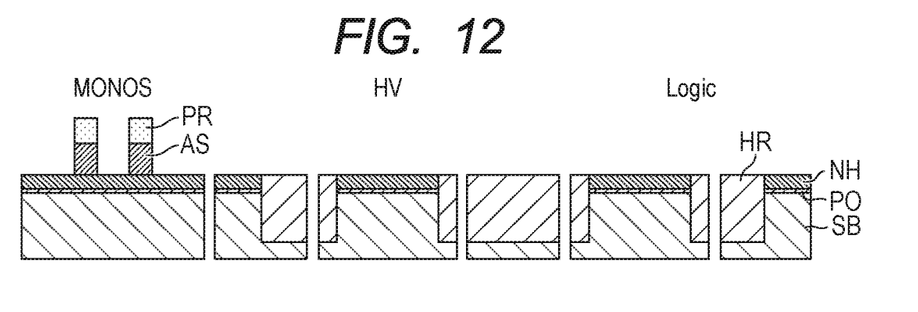
FIG. 12 is a cross-sectional view showing a manufacturing procedure of the semiconductor device following that of FIG. 11.

Next, as shown in FIG. 12, the amorphous film AS is etched by anisotropic dry etching with a chlorine gas ($Cl_2$) or a hydrogen bromide gas (HBr) while using the photoresist film PR in the MONOS formation region as an etching mask. Then, the photoresist film PR remaining on the amorphous silicon film AS without being etched is removed by ashing. After removal of the photoresist film PR by ashing, a projection formed at the corner or step portion is subjected to edging treatment (poly-etch treatment) if necessary.

Figure 13:
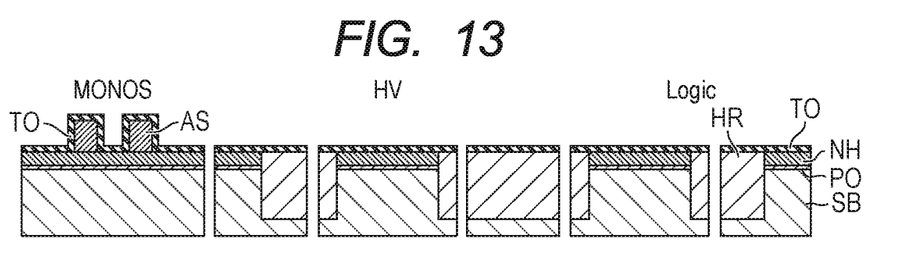
FIG. 13 is a cross-sectional view showing a manufacturing procedure of the semiconductor device following that of FIG. 12.

Next, as shown in FIG. 13, a TEOS film (silicon oxide film) TO having a thickness of from about 30 nm to 50 nm is formed on the main surface of the semiconductor substrate SB by CVD using TEOS (tetra ethyl ortho silicate) so as to cover the pattern of the amorphous silicon film ASA formed in the MONOS formation region.

Figure 14:
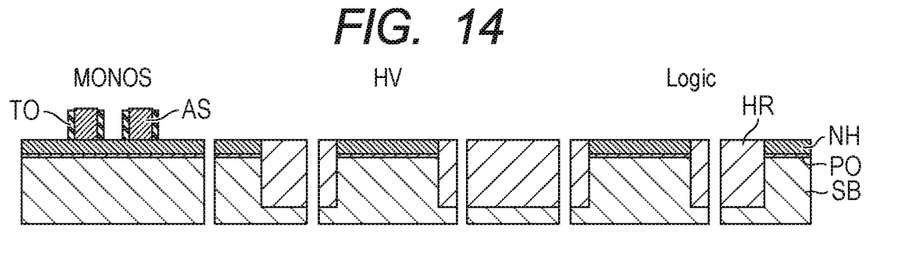
FIG. 14 is a cross-sectional view showing a manufacturing procedure of the semiconductor device following that of FIG. 13.

Next, as shown in FIG. 14, the amorphous film AS on the surface of the semiconductor substrate SB is removed while leaving the TEOS film TO formed on the side wall of the pattern of the amorphous silicon film AS by etch-back treatment of the main surface of the semiconductor substrate SB by dry etching.

Figure 15:
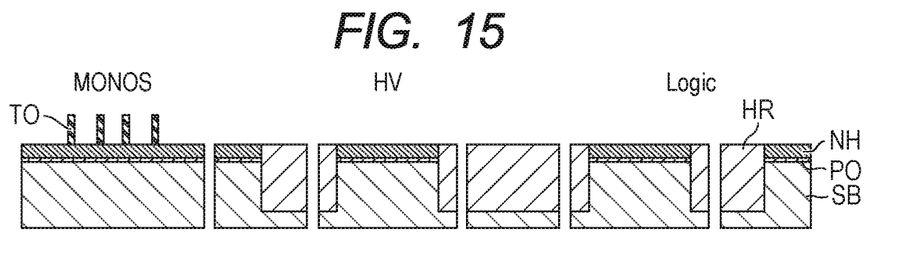
FIG. 15 is a cross-sectional view showing a manufacturing procedure of the semiconductor device following that of FIG. 14.

Next, as shown in FIG. 15, the amorphous film AS in the MONOS formation region is removed by etch-back treatment using dry etching. As a result, a $SiO_2$ hard mask made of the TEOS film (silicon oxide film) TO is formed in the MONOS formation region. When this amorphous silicon film AS is subjected to etch-back treatment, the TEOS film (silicon oxide film) TO in the MONOS formation region and the HARP film HR (element isolation film EI) in the peripheral element formation region are also etched to show a slight retreat.

Figure 16:
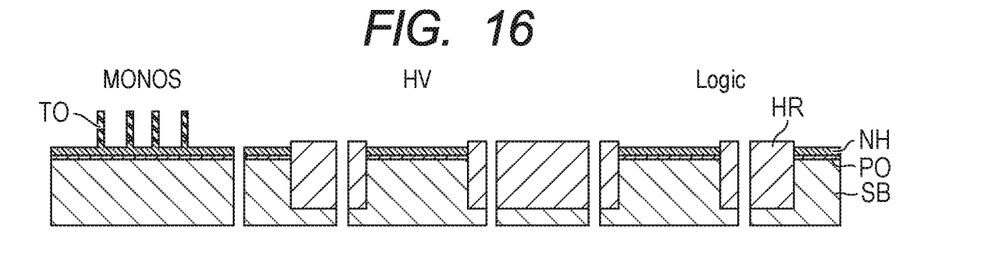
FIG. 16 is a cross-sectional view showing a manufacturing procedure of the semiconductor device following that of FIG. 15.

Next, as shown in FIG. 16, the main surface (silicon nitride film NH) of the semiconductor substrate SB is subjected to etch-back treatment using dry etching, with the $SiO_2$ hard mask as an etching mask. The etch-back quantity of the silicon nitride film NH is required to be equal to or more than the retreat quantity of the silicon nitride film NH in the MONOS formation region (fin FI portion) in the STI etching (FIG. 19) which will be performed in a step subsequent thereto. Therefore, it is preferred to continue the etch-back treatment until the etch-back quantity (retreat quantity) of the silicon nitride film NH in the peripheral element formation region becomes, as a rough standard, about 20 nm (from the lower limit: 5 nm to the upper limit: 50 nm).

Figure 17:
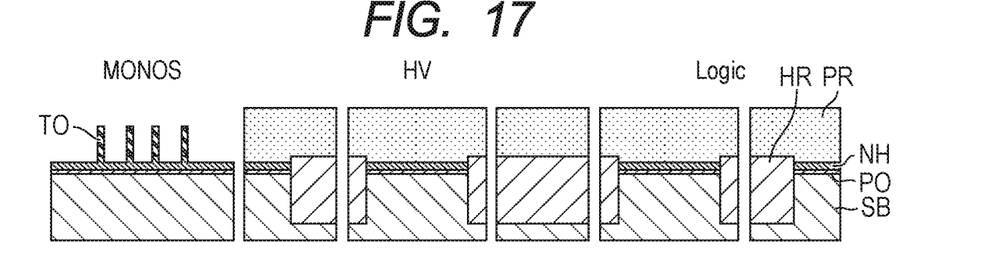
FIG. 17 is a cross-sectional view showing a manufacturing procedure of the semiconductor device following that of FIG. 16.

Next, as shown in FIG. 17, a photoresist film PR is applied onto the main surface of the semiconductor substrate SB to cover a region (peripheral element formation region) other than the MONOS formation region with the photoresist film PR by lithography.

Figure 18:
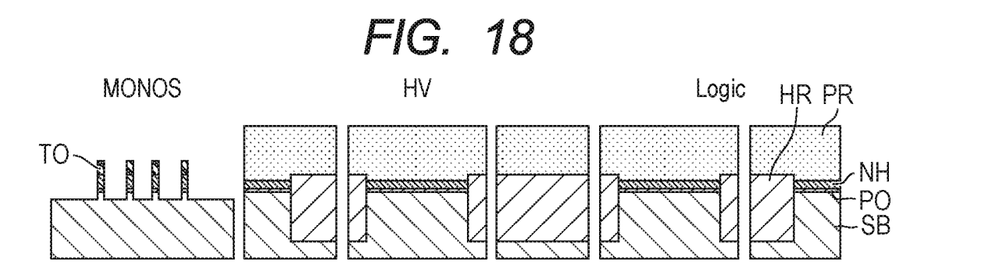
FIG. 18 is a cross-sectional view showing a manufacturing procedure of the semiconductor device following that of FIG. 17.
Figure 19:
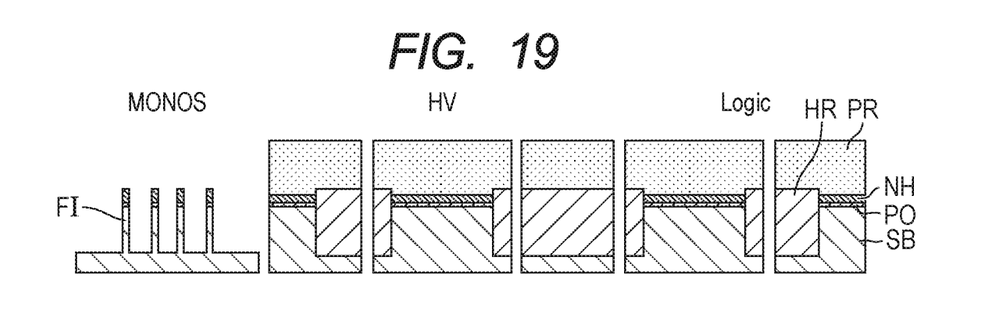
FIG. 19 is a cross-sectional view showing a manufacturing procedure of the semiconductor device following that of FIG. 18.

Next, as shown in FIGS. 18 and 19, the silicon nitride film NH and the semiconductor substrate SB in the MONOS formation region are etched in two steps to form a trench for element isolation (EI) (STI trench). First, as shown in FIG. 18, a first stage ($1^{st}$ step) is performed to etch the silicon nitride film NH in the MONOS formation region, with the $SiO_2$ hard mask (TEOS film TO) as an etching mask. Under ordinary dry etching conditions, since there is not a large difference in etching rate (selectivity) between the silicon nitride film ($Si_3N_4$) and the silicon oxide film ($SiO_2$), the $SiO_2$ hard mask (TEOS film TO) retreats as the silicon nitride film ($Si_3N_4$) is etched.

Next, as shown in FIG. 19, a second stage ($2^{nd}$ step) is performed to etch the semiconductor substrate SB (silicon) with the $SiO_2$ hard mask (TEOS film TO) which has remained without being etched as an etching mask. During this etching, the respective dry etching thicknesses of the silicon oxide film ($SiO_2$) and silicon (Si) satisfy the following equation: $SiO_2 \ll Si$.

By the first-stage (1st step) dry etching shown in FIG. 18, the SiO₂ hard mask (TEOS film TO) retreats considerably. Although the etch selectivity to silicon (Si) relative to the silicon oxide film (SiO₂) is high, a partial disappearance of the SiO₂ hard mask (TEOS film TO) may occur until completion of etching because the thickness of the SiO₂ hard mask (TEOS film TO) becomes thin and an etching thickness of silicon (semiconductor substrate SB) for the formation of a trench (STI trench) is as large as from 200 nm to 300 nm. When the SiO₂ hard mask (TEOS film TO) disappears during etching, the silicon nitride film NH in the MONOS formation region (fin FI portion) retreats. Then, the photoresist film PR in the peripheral element formation region is removed by asking.

Figure 20:
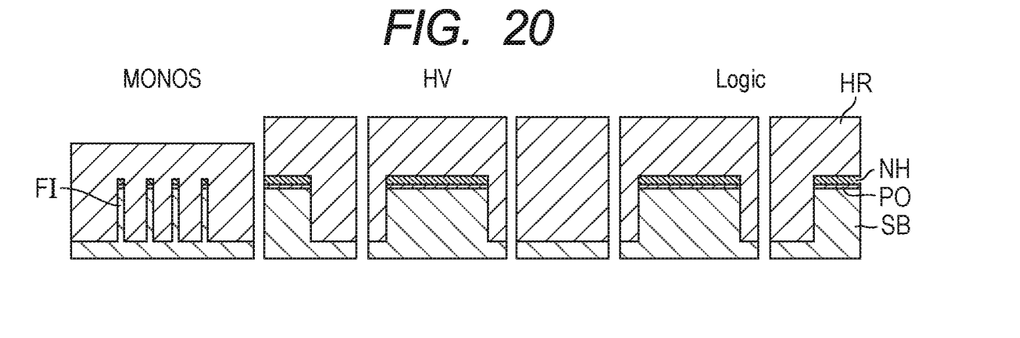
FIG. 20 is a cross-sectional view showing a manufacturing procedure of the semiconductor device following that of FIG. 19.

Next, as shown in FIG. 20, a HARP film HR is formed on the main surface of the semiconductor substrate SB to fill a trench (STI trench) between the fins FI with the film.

Figure 21:
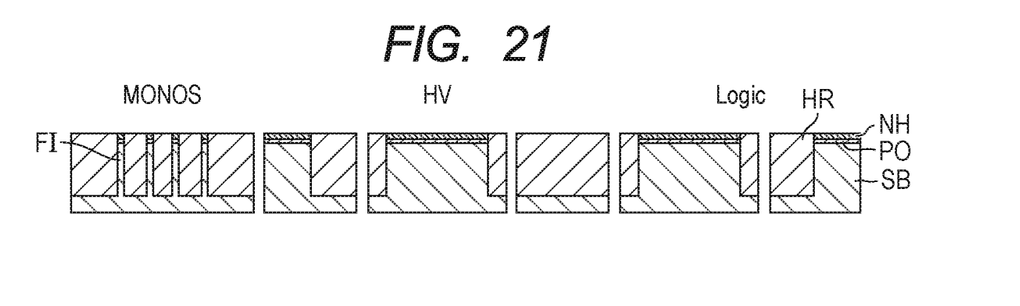
FIG. 21 is a cross-sectional view showing a manufacturing procedure of the semiconductor device following that of FIG. 20.

Next, as shown in FIG. 21, the HARP film HR on the main surface of the semiconductor substrate SB is polished and removed by CMP while leaving the HARP film HR in the trench (STI trench) in the MONOS formation region. During this polishing, the silicon nitride film NH functions as a CMP stopper. As a result, element isolation EI made of the HARP film HR is formed in the MONOS formation region.

During the above-described CMP, it is preferred to use a self stop type slurry causing less dishing of the silicon oxide film in order to prevent dishing in the MONOS formation region (fin FI portion) (excessive polishing of the HARP film HR). The self stop type slurry is characterized by that it can polish the silicon oxide film (SiO₂) and the silicon nitride film (Si₃N₄) with a small difference in polishing rate and can polish each of them at a low polishing rate.

In FIG. 19, with respect to the portion of the SiO₂ hard mask (TEOS film TO) of the fin FI portion that has remained without being etched, the remaining SiO₂ hard mask (TEOS film TO) as well as the HARP film HR is polished and removed by CMP. With respect to the portion of the SiO₂ hard mask (TEOS film TO) which has disappeared from the fin FI portion, on the other hand, if etch-back of the silicon nitride film NH (retreat of Si₃N₄) shown in FIG. 16 is not performed, polishing of the HARP film is almost stopped when the silicon nitride film NH in the peripheral element formation region (planar portion) is exposed, making it difficult to cause appearance (exposure) of the silicon nitride film NH in the MONOS formation region (fin FI portion).

In the present example, as shown in FIG. 16, the silicon nitride film NH in the peripheral element formation region (planar portion) is made thinner (retreated) by etch-back in advance (meaning, before CMP for the formation of the element isolation EI in the MONOS formation region (fin FI portion)). At the time when the silicon nitride film NH is exposed in the peripheral element formation region (planar portion), therefore, the appearance (exposure) of the silicon nitride film NH in the MONOS formation region (fin FI portion) is completed.

Even if the exposure of the silicon nitride film NH in the MONOS formation region (fin FI portion) is performed prior to that in the peripheral element formation region (planar portion), the silicon nitride film NH does not function as a polish stopper film upon CMP because the data percentage in the MONOS formation region (fin FI portion) (pattern area of the silicon nitride film NH) is low. Therefore, the polishing rate does not decrease and polishing of the HARP film HR continues until the silicon nitride film NH is exposed in the peripheral element formation region (planar portion). This facilitates appearance (exposure) of the silicon nitride film NH in both the MONOS formation region (fin FI portion) and the peripheral element formation region (planar portion).

Figure 22:
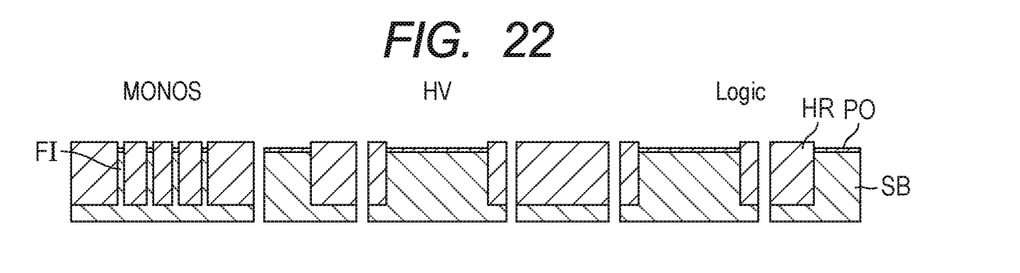
FIG. 22 is a cross-sectional view showing a manufacturing procedure of the semiconductor device following that of FIG. 21.

Next, as shown in FIG. 22, the silicon nitride film NH on the main surface of the semiconductor substrate SB is selectively removed by wet etching or dry etching.

Figure 23:
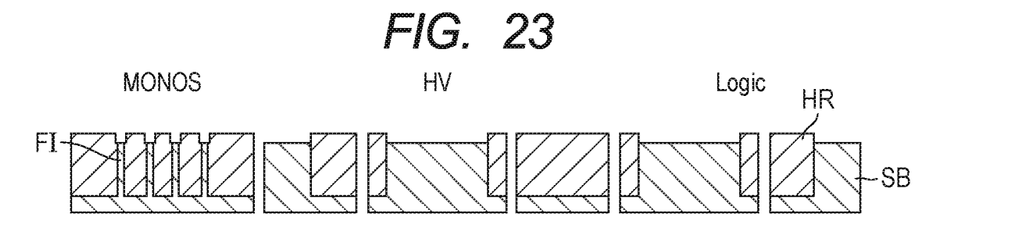
FIG. 23 is a cross-sectional view showing a manufacturing procedure of the semiconductor device following that of FIG. 22.

Next, as shown in FIG. 23, the pad oxide film (silicon oxide film) PO on the main surface of the semiconductor substrate SB is selectively removed by wet etching, followed by sacrificial oxidation (formation of a silicon oxide film to be removed later using hydrofluoric acid or the like) or well injection (ion implantation).

Figure 24:
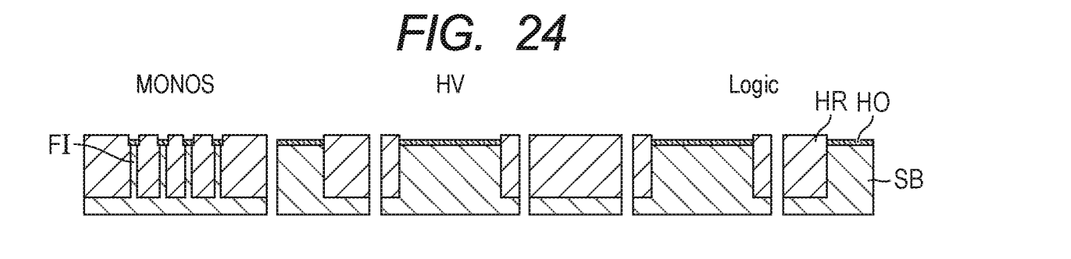
FIG. 24 is a cross-sectional view showing a manufacturing procedure of the semiconductor device following that of FIG. 23.

Next, as shown in FIG. 24, a thin silicon oxide film (thermal oxide film) HO is formed on the exposed surface of the semiconductor substrate SB by thermal oxidation.

Figure 25:
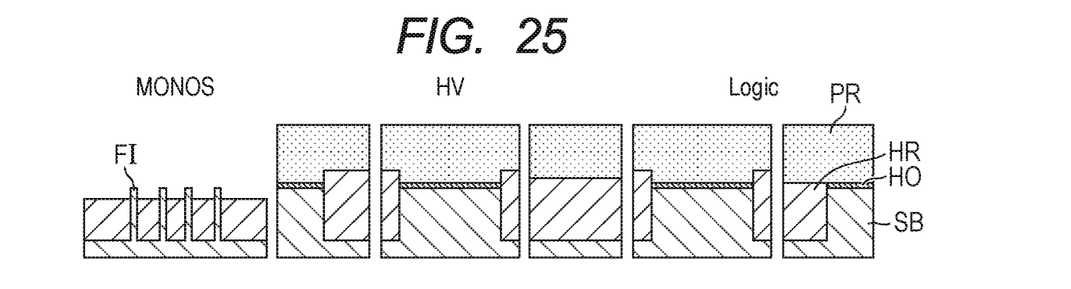
FIG. 25 is a cross-sectional view showing a manufacturing procedure of the semiconductor device following that of FIG. 24.

Next, as shown in FIG. 25, a photoresist film PR is applied onto the main surface of the semiconductor substrate SB and then lithography is performed to cover a region (peripheral element formation region) other than the MONOS formation region with the photoresist film PR. Then, a portion of the HARP film HR of the MONOS formation region (fin FI portion) and the silicon oxide film (thermal oxide film) HO are removed by wet etching. Ashing is then performed for removal of the photoresist film PR on the peripheral element formation region, formation of a silicon oxide film (HV oxide film deposition) in the high withstand element (HV element) formation region, annealing, and the like.

Figure 26:
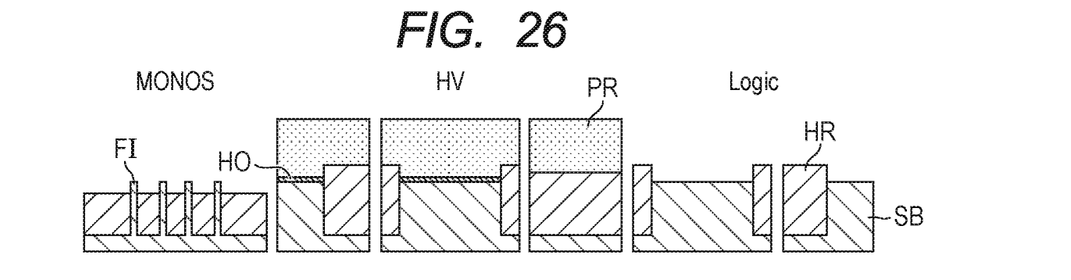
FIG. 26 is a cross-sectional view showing a manufacturing procedure of the semiconductor device following that of FIG. 25.

Next, as shown in FIG. 26, a photoresist film PR is applied onto the main surface of the semiconductor substrate SB and lithography is performed to cover a region (high withstand element (HV element) formation region) other than the MONOS formation region and the logic element formation region with the photoresist film PR. Then, the silicon oxide film (thermal oxide film) HO in the logic element formation region is removed by wet etching. The photoresist film PR on the high withstand element (HV element) formation region is then removed by asking.

Figure 27:
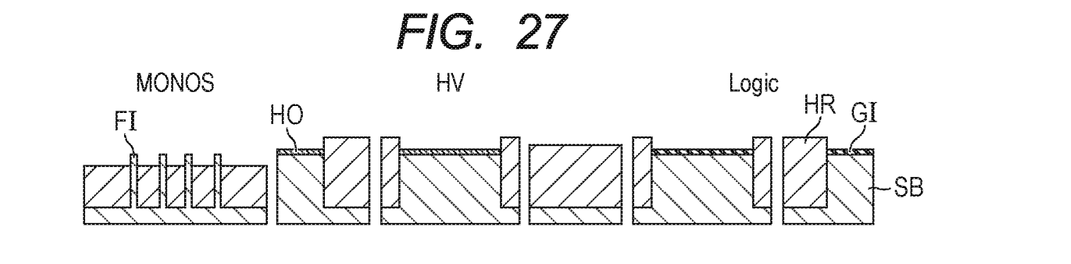
FIG. 27 is a cross-sectional view showing a manufacturing procedure of the semiconductor device following that of FIG. 26.

Next, as shown in FIG. 27, a thermal oxide film (silicon oxide film) which will be a gate insulating film GI is formed in the logic element formation region by thermal oxidation.

Then, in each of the MONOS formation region, the high withstand element (HV element) formation region, and the logic element formation region, steps of forming a gate electrode, a source-drain region, an interlayer insulating film IL, a contact plug (via) CP, a wiring MW, and the like are performed to complete the structure of a semiconductor device having both a planar type transistor and a fin type transistor as shown in FIGS. 2A and 2B.

Etch-Back Quantity of Silicon Nitride Film NH in Present Example

The upper limit and the lower limit of the etch-back quantity (retreat quantity) of the silicon nitride film NH in the peripheral element formation region shown in FIG. 16 will next be described.

As described above, the silicon nitride film NH before CMP in the peripheral element formation region (planar portion) shown in FIG. 20 should be made thinner than the silicon nitride film NH after etching in the MONOS formation region (fin FI portion) shown in FIG. 18. This means that the etch-back quantity of the silicon nitride film NH in the peripheral element formation region shown in FIG. 16 should be set equal to or larger than the retreat quantity (etching quantity) of the silicon nitride film NH shown in FIG. 18. The etch-back quantity is preferably about 20 nm. When the retreat quantity (etching quantity) of the silicon nitride film NH in FIG. 18 decreases under improved dry etching conditions or the like and the etch-back quantity (retreat quantity) in FIG. 16 is 5 nm or less, another method such as increasing the CMP polishing time becomes a candidate of a solution. In the present example, therefore, the lower limit of the etch-back quantity (retreat quantity) is set at 5 nm.

On the other hand, the thickness of the silicon nitride film NH in the peripheral element formation region (planar portion) after the etch-back in FIG. 16 is required to be equal to or more than a protruding quantity of the STI (HARP film HR). It is preferred to set the etch-back quantity (retreat quantity) at about 20 nm because the thickness of the silicon nitride film NH after second CMP shown in FIG. 21 is 70 nm and the target protrusion of the STI (target value) is 50 nm.

The limit of the thickness of the silicon nitride film NH is determined by the height of the mandrel. Increasing the maximum allowance of the height of the mandrel from 160 nm to 190 nm in consideration of an exposure allowable range without a problem in photolithography, the $SiO_2$ hard mask in the fin FI portion becomes thick so that the silicon nitride film NH can be set to have a large thickness. By the thickening of the mandrel, it can be made thicker by about 30 nm so that in the present example, the upper limit of the etch-back quantity (retreat quantity) is set at 50 nm.

As described above, the manufacturing method of the present example facilitates appearance (exposure) of the silicon nitride film NH in the MONOS formation region (fin FI portion) by thinning the silicon nitride film NH in the peripheral element formation region (planar portion) by carrying out etch-back prior to CMP for the formation of the element isolation EI in the MONOS formation region (fin FI portion).

The silicon nitride film NH in the peripheral element formation region (planar portion) can be dished by the etch-back right after formation of the $SiO_2$ hard mask in the MONOS formation region (fin FI portion) without adding another step (without an additional reticle).

Further, the retreat of the silicon nitride film NH in the peripheral element formation region (planar portion) can be permitted so that the degree of freedom for dry etching conditions or the shape of the mandrel increases.

Example 2

A method of manufacturing a semiconductor device of Example 2 will next be described referring to FIGS. 28 to 31. In Example 1, a polishing residue of the silicon nitride film NH ($Si_3N_4$ hard mask) in the peripheral element formation region (planar portion) is prevented by adding thinning treatment (etch-back) of the silicon nitride film NH between the CMP step (FIG. 9) for the formation of STI (element isolation EI) in the peripheral element formation region (planar portion) and the CMP step (FIG. 21) for the formation of STI (element isolation EI) in the MONOS formation region (fin FI portion). On the other hand, the manufacturing method of the present example is different from that of Example 1 in thinning of the silicon nitride film ($Si_3N_4$ hard mask) in the peripheral element formation region (planar portion) in advance by photolithography.

Method of Manufacturing Semiconductor Device of Present Example

A difference from Example 1 will hereinafter be described mainly.

Figure 28:
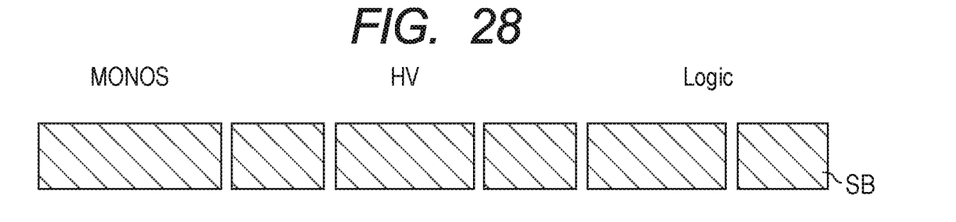
FIG. 28 is a cross-sectional view showing a manufacturing procedure of a semiconductor device according to another embodiment of the invention (Example 2)

First, as shown in FIG. 28, a semiconductor substrate SB for the formation of a planar type transistor and a fin type transistor is provided. Each transistor is formed on the surface (main surface) of the semiconductor substrate SB (this step corresponds to the step of FIG. 4 of Example 1).

Figure 29:
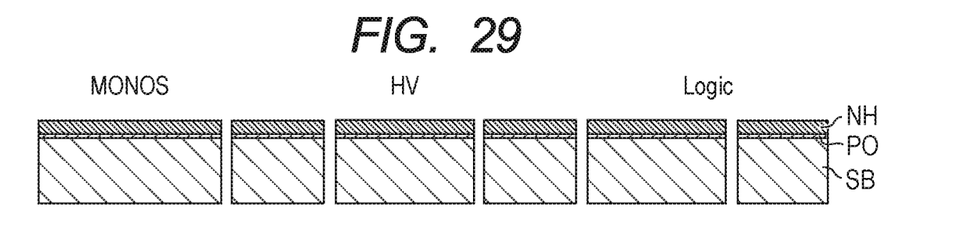
FIG. 29 is a cross-sectional view showing a manufacturing procedure of the semiconductor device following that of FIG. 28.

Then, as shown in FIG. 29, the main surface of the semiconductor substrate SB is thermally oxidized to form a pad oxide film (silicon oxide film) PO having a thickness of, for example, from about 10 nm to 11 nm. Then, on the pad oxide film PO, a silicon nitride film NH having a thickness of, for example, about 120 nm (from 100 nm to 150 nm) and serving as a hard mask for the formation of element isolation EI is formed by plasma CVD (chemical vapor deposition) (this step corresponds to the step of FIG. 5 in Example 1).

Figure 30:
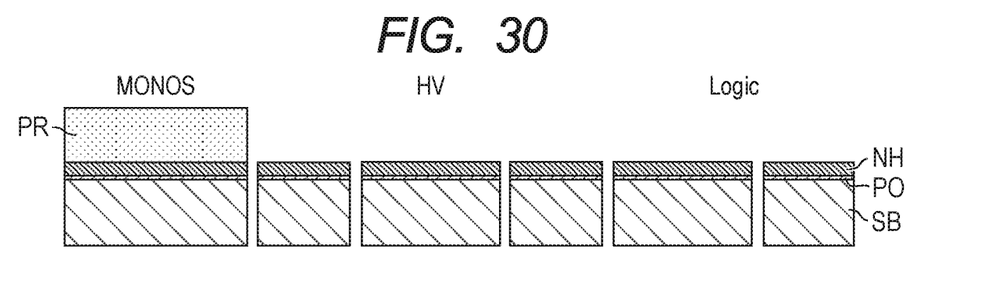
FIG. 30 is a cross-sectional view showing a manufacturing procedure of the semiconductor device following that of FIG. 29.

Next, as shown in FIG. 30, a photoresist film PR is applied onto the main surface of the semiconductor substrate SB to cover a region (MONOS formation region) other than a high withstand element (HV element) formation region and a logic element formation region with the photoresist film PR by lithography.

Figure 31:
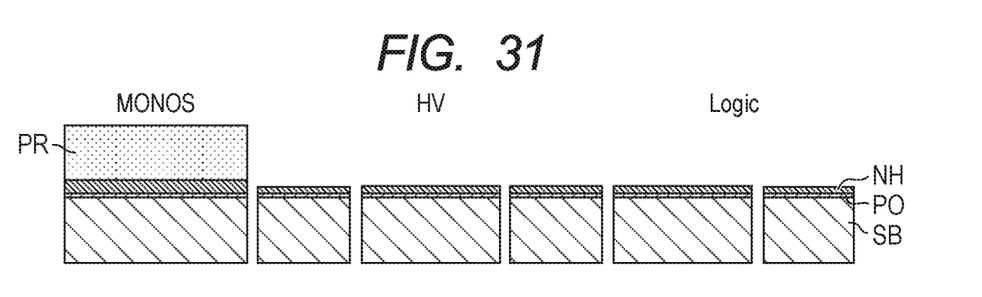
FIG. 31 is a cross-sectional view showing a manufacturing procedure of the semiconductor device following that of FIG. 30.

Next, as shown in FIG. 31, the silicon nitride film NH in the high withstand element (HV element) formation region and the logic element formation region is etched (retreated) by dry etching or wet etching with the photoresist film PR on the MONOS formation region as a mask. During etching, it is preferred to adjust the etching quantity of the silicon nitride film NH to about 20 nm (lower limit: 5 nm to upper limit: 50 nm) which is similar to the etch-back quantity in the step shown in FIG. 16 in Example 1. Then, asking is performed to remove the photoresist film PR in the MONOS formation region.

In steps after that, treatments similar to those described referring to from FIG. 6 to FIG. 27 except the step (etch-back of the $Si_3N_4$ hard mask) of FIG. 16 in Example 1 are performed.

The present example requires addition of a mask for exclusive use in photolithography shown in FIG. 30 but an advantage similar to that of Example 1 can be achieved by previously thinning the silicon nitride film NH in the peripheral element formation region (planar portion) prior to the CMP step (FIG. 9) for the formation of STI (element isolation EI) in the peripheral element formation region (planar portion).

The step (etch-back of the $Si_3N_4$ hard mask) of FIG. 16 in Example 1 may be performed even in the present example by suppressing (reducing) the etching quantity of the silicon nitride film NH in FIG. 31.

Example 3

A method of manufacturing a semiconductor device of Example 3 will next be described referring to FIGS. 32 to 35. In the present example, instead of the thinning treatment (FIG. 16) of the silicon nitride film NH in Example 1, the CMP step of both the peripheral element formation region (planar portion) and the MONOS formation region (fin FI portion) is followed by positive oxidation (forced oxidation) of the surface of the silicon nitride film NH exposed in the peripheral element formation region (planar portion). The manufacturing method of the present example is different from that of Example 1 in that the $Si_3N_4$ hard mask of the MONOS formation region is caused to appear (is exposed) by carrying out further CMP.

Method of Manufacturing Semiconductor Device of the Present Example

A difference from Example 1 will hereinafter be described mainly.

First, the steps of Example 1 shown in from FIG. 4 to FIG. 19 except FIG. 16 are performed.

Figure 32:
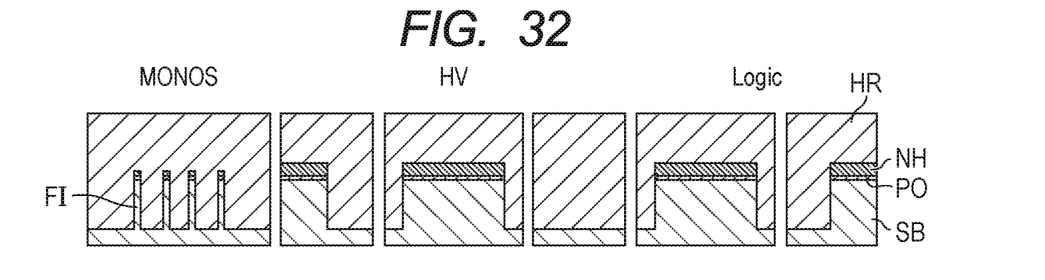
FIG. 32 is a cross-sectional view showing a manufacturing procedure of a semiconductor device according to a further embodiment of the invention (Example 3)

Next, as shown in FIG. 32, a HARP film HR is formed on the main surface of the semiconductor substrate SB to fill a trench (STI trench) present between the fins FI with the film (corresponding to the step of Example 1 shown in FIG. 20).

Figure 33:
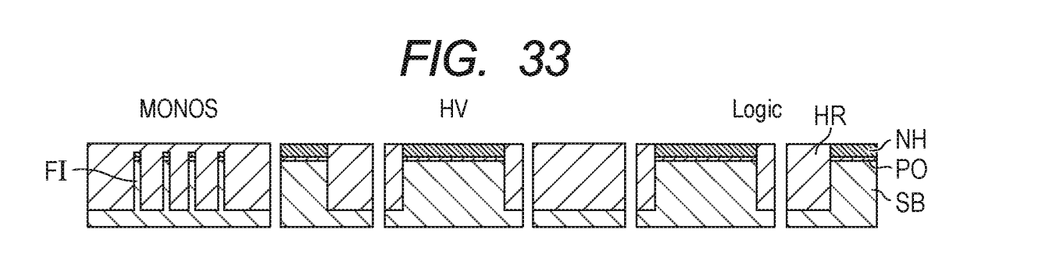
FIG. 33 is a cross-sectional view showing a manufacturing procedure of the semiconductor device following that of FIG. 32.

Next, as shown in FIG. 33, the HARP film HR on the main surface of the semiconductor substrate SB is polished and removed by CMP while leaving the HARP film HR in the trench (STI trench) of the MONOS formation region. During polishing, the silicon nitride film NH in the peripheral element formation region (planar portion) functions as a CMP stopper. In the MONOS formation region (fin FI portion), the silicon nitride film NH is retreated in a portion of the fin FI portion so that the silicon nitride film NH ($SiO_2$ hard mask) of the fin FI portion does not appear (is not exposed) after CMP.

Figure 34:
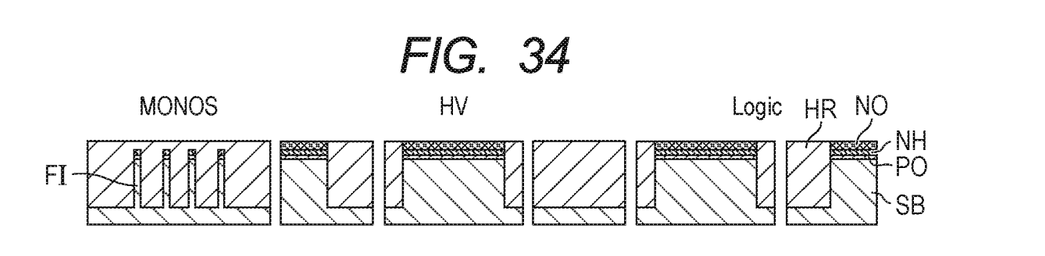
FIG. 34 is a cross-sectional view showing a manufacturing procedure of the semiconductor device following that of FIG. 33.

Next, as shown in FIG. 34, the surface of the silicon nitride film NH exposed in the peripheral element formation region (planar portion) is subjected to positive oxidation treatment (forced oxidation) to form an oxide layer NO of the silicon nitride film NH. This oxidation treatment uses, for example, ISSG oxidation (In-Situ Steam Generation). The thickness of the oxide layer NO of the silicon nitride film NH is preferably adjusted to from about 5 nm to 50 nm.

Figure 35:
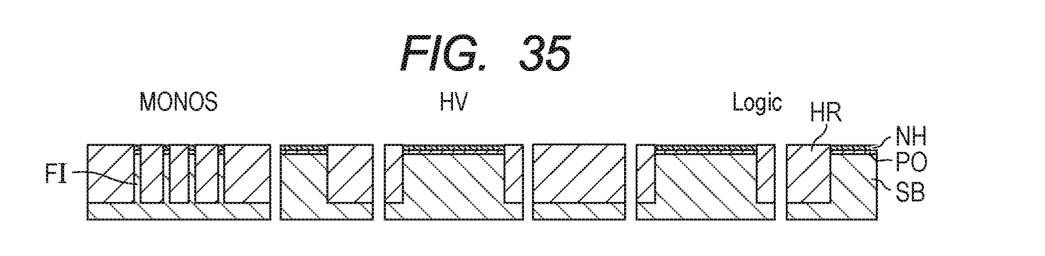
FIG. 35 is a cross-sectional view showing a manufacturing procedure of the semiconductor device following that of FIG. 34.

Next, as shown in FIG. 35, the main surface of the semiconductor substrate SB is subjected to CMP. Due to the oxide layer NO formed on the surface of the silicon nitride film NH in the peripheral element formation region (planar portion), the polishing rate increases, making it possible to easily cause appearance (exposure) of the silicon nitride film NH ($SiO_2$ hard mask) in the MONOS formation region (fin FI portion).

Steps thereafter are similar to those of Example 1 described referring to FIG. 22 to FIG. 27.

In the present example, the positive oxidation treatment (forced oxidation) of the surface of the silicon nitride film NH exposed in the peripheral element formation region (planar portion) facilitates appearance (exposure) of the $Si_3N_4$ hard mask in the MONOS formation region (fin FI portion). As a result, an advantage similar to that of Example 1 can be obtained.

In the present example, the thickness of the silicon nitride film NH in the peripheral element formation region (planar portion) is controlled by the oxidation degree (oxidation conditions) in the step of oxidization treatment (forced oxidation) of the silicon nitride film NH so that the film thickness can be controlled easily. In addition, the silicon nitride film NH in the peripheral element formation region (planar portion) can be retreated without adding the mask as used in Example 2.

In the above-described Examples, as an example of a semiconductor product having both a planar type transistor and a fin type transistor, that having both a MOSFET (metal-oxide-semiconductor field-effect transistor) as the planar type transistor and a split-gate MONOS flash memory (SG-MONOS) using a MONOS film as the fin type transistor is shown. The invention can be applied not only to the above-described combination but also to a MISFET (metal-insulator-semiconductor field-effect transistor) comprised of a High-k gate insulating film (a gate insulating film including a high dielectric film) and a metal gate electrode, or the like.

The invention made by the present inventors has been described specifically based on some embodiments. It is needless to say that the invention is not limited to the above embodiments but can be modified in various ways without departing from the gist of the invention.

What is claimed is:

1. A method of manufacturing a semiconductor device, comprising the steps of:
   (a) forming a silicon nitride film over a main surface of a semiconductor substrate;
   (b) after the step (a), forming a first trench in a first region of the main surface;
   (c) after the step (b), forming a first silicon oxide film over the main surface so as to fill the first trench;
   (d) after the step (c), performing first CMP treatment to the main surface to remove the first silicon oxide film over the main surface while leaving the first silicon oxide film in the first trench;
   (e) after the step (d), etching the silicon nitride film by a predetermined quantity in the first region by performing dry etching treatment to the main surface;
   (f) after the step (e), forming a second trench in a second region of the main surface;
   (g) after the step (f), forming a second silicon oxide film over the main surface so as to fill the second trench; and
   (h) after the step (g), performing second CMP treatment to the main surface to remove the second silicon oxide film over the main surface while leaving the second silicon oxide film in the second trench,
   wherein the step (b) and the step (f) are performed by photolithography and dry etching, and
   wherein the method further comprises between the step (d) and the step (e), the steps of:
   (i) forming an amorphous silicon film over the main surface of the semiconductor substrate;
   (j) after the step (i), forming a first mask pattern formed of the amorphous silicon film in the second region by photolithography and dry etching;
   (k) after the step (j), forming a third silicon oxide film over the main surface of the semiconductor substrate so as to cover the first mask pattern and forming a sidewall spacer formed of the third silicon oxide film over a side wall of the first mask pattern by dry etching; and
   (l) after the step (k), selectively removing the first mask pattern by dry etching to form a second mask pattern formed of the sidewall spacer in the second region.

2. The method according to claim 1, wherein, in the step (e), an etching quantity of the silicon nitride film is 5 nm or more and 50 nm or less.

3. A method of manufacturing a semiconductor device, comprising the steps of:
   (a) forming a silicon nitride film over a main surface of a semiconductor substrate;
   (b) after the step (a), etching the silicon nitride film by a predetermined quantity in a first region of the main surface by photolithography and dry etching;
   (c) after the step (b), forming a first trench in the first region;
   (d) after the step (c), forming a first silicon oxide film over the main surface so as to fill the first trench;
   (e) after the step (d), performing first CMP treatment to the main surface to remove the first silicon oxide film over the main surface while leaving the first silicon oxide film in the first trench;
   (f) after the step (e), forming a second trench in a second region of the main surface;
   (g) after the step (f), forming a second silicon oxide film over the main surface so as to fill the second trench; and
   (h) after the step (g), performing second CMP treatment to the main surface to remove the second silicon oxide film over the main surface while leaving the second silicon oxide film in the second trench, wherein the step (c) and the step (f) are performed by photolithography and dry etching, and wherein the method further comprises between the step (e) and the step (f), the steps of:

(i) forming an amorphous silicon film over the main surface of the semiconductor substrate;

(j) after the step (i), forming a first mask pattern formed of the amorphous silicon film in the second region by photolithography and dry etching;

(k) after the step (j), forming a third silicon oxide film over the main surface of the semiconductor substrate so as to cover the first mask pattern and forming a sidewall spacer formed of the third silicon oxide film over a side wall of the first mask pattern by dry etching; and (l) after the step (k), selectively removing the first mask pattern by dry etching to form a second mask pattern formed of the sidewall spacer in the second region.

4. The method according to claim 3, wherein, in the step (b), an etching quantity of the silicon nitride film is 5 nm or more and 50 nm or less.

5. A method of manufacturing a semiconductor device, comprising the steps of:

(a) forming a silicon nitride film over a main surface of a semiconductor substrate;

(b) after the step (a), forming a first trench in a first region of the main surface;

(c) after the step (b), forming a first silicon oxide film over the main surface so as to fill the first trench;

(d) after the step (c), performing first CMP treatment to the main surface to remove the first silicon oxide film over the main surface while leaving the first silicon oxide film in the first trench;

(e) after the step (d), forming a second trench in a second region of the main surface;

(f) after the step (e), forming a second silicon oxide film over the main surface so as to fill the second trench;

(g) after the step (f), performing second CMP treatment to the main surface to remove the second silicon oxide film over the main surface while leaving the second silicon oxide film in the second trench;

(h) after the step (g), performing oxidation treatment to the main surface to form an oxide layer on a surface of the silicon nitride film exposed from the main surface; and (i) after the step (h), performing third CMP treatment to the main surface to remove the oxide layer, wherein the step (b) and the step (e) are performed by photolithography and dry etching, and wherein the method further comprises, between the step (d) and the step (e), the steps of:

(j) forming an amorphous silicon film over the main surface of the semiconductor substrate;

(k) after the step (j), forming a first mask pattern formed of the amorphous silicon film in the second region by photolithography and dry etching;

(l) after the step (k), forming a third silicon oxide film over the main surface of the semiconductor substrate so as to cover the first mask pattern and forming a sidewall spacer formed of the third silicon oxide film over a side wall of the first mask pattern by dry etching; and (m) after the step (l), selectively removing the first mask pattern by dry etching to form a second mask pattern formed of the sidewall spacer in the second region.

6. The method according to claim 5, wherein, in the step (h), a thickness of the oxide layer is 5 nm or more and 50 nm or less.

* * * * *